(12) United States Patent
Tanimoto et al.

(10) Patent No.: US 7,378,668 B2
(45) Date of Patent: May 27, 2008

(54) METHOD AND APPARATUS FOR APPLYING CHARGED PARTICLE BEAM

(75) Inventors: Sayaka Tanimoto, Kodaira (JP); Yasunari Sohda, Kawasaki (JP); Yasuhiro Someda, Utsunomiya (JP); Masaki Hosoda, Saitama (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 169 days.

(21) Appl. No.: 11/475,014

(22) Filed: Jun. 27, 2006

(65) Prior Publication Data
US 2006/0289781 A1    Dec. 28, 2006

(30) Foreign Application Priority Data
Jun. 28, 2005    (JP)    ............................. 2005-188345

(51) Int. Cl.
*H01J 3/14*    (2006.01)
*G21K 1/08*    (2006.01)

(52) U.S. Cl. .................. 250/396 R; 250/306; 250/207; 250/398; 250/396 ML; 250/492.2; 250/492.22; 250/492.3

(58) Field of Classification Search ............ 250/396 R, 250/398, 396 ML, 306, 307, 492.2, 492.22, 250/492.3
See application file for complete search history.

(56) References Cited

U.S. PATENT DOCUMENTS
2006/0056131 A1* 3/2006 Tanimoto et al. ........... 361/234

FOREIGN PATENT DOCUMENTS
| JP | 2002-267221 | 3/2000 |
| JP | 2002-319532 | 4/2001 |
| JP | 2006-080304 | 9/2004 |

* cited by examiner

*Primary Examiner*—Nikita Wells
(74) *Attorney, Agent, or Firm*—Reed Smith LLP; Stanley P. Fisher, Esq.; Juan Carlos A. Marquez, Esq.

(57) ABSTRACT

In a charged particle beam applying apparatus such as an electron beams lithography system, there is a technology that facilitates positional adjustment of a crossover and improves throughput of the apparatus. A front focal plane of a condenser lens is provided with a sharp end face (crossover regulation edge) for regulating the height of the crossover on a beam axis. By using the crossover regulation edge to measure the shape of an electron beam, the shape of the beam on the front focal plane of the condenser lens can be always checked even if the height of the crossover formed by an electron gun or the resistance of a source forming lens is changed.

11 Claims, 13 Drawing Sheets

SIZE OF SOURCE CROSSOVER

SIZE OF SOURCE CROSSOVER

METHOD AND APPARATUS FOR APPLYING CHARGED PARTICLE BEAM

CROSS-REFERENCE TO REIATED APPLICATION

The present application claims priority from Japanese patent application No. JP 2005-188345 filed on Jun. 28, 2005, the content of which is hereby incorporated by reference into this application.

BACKGROUND OF THE INVENTION

The present invention relates to a method and apparatus for applying charged particle beams and, particularly, to a technology effectively applied to a high-speed and high-accuracy apparatus for applying charged particle beams, which is used for semiconductor manufacturing devices and semiconductor inspection apparatuses.

Examples of technologies studied by the present inventors are as follows in a charged electron beam applied technology for use in a semiconductor manufacturing process.

In the semiconductor manufacturing process, an electron beam lithography system is used for drawing a desired circuit pattern on a wafer or mask as a subject. Also, electron microscopes, electron-beam inspection devices, and other devices are used for irradiating the subject with electron beams and checking, from signals of secondary electrons or the like produced, the shape of a pattern formed on the subject or the presence or absence of a defect of the pattern.

In these semiconductor manufacturing devices applying electron beams, it is an important problem that the speed of processing the subject, i.e., throughput is improved along with accuracy. To solve this problem, in Japanese Patent Laid-Open Publication No. 2001-267221 and Japanese Patent Laid-Open Publication No. 2002-319532, for example, there is proposed a multibeam method in which: a test sample is irradiated with a plurality of electron beams; these electron beams are deflected for scanning on the test sample; and, depending on the pattern to be drawn, the plurality of electron beams are individually turned on/off to draw the pattern. One example of such an electron beam lithography system of this type is described by using a schematic drawing of FIG. 13.

In FIG. 13, a one-dot-chain line represents a beam axis, which is an axis on which axes of symmetry of an electron gun and an electromagnetic lens formed in approximately rotation symmetry should coincide with each other, the beam axis serving as a reference of a beam path.

In this example, a thermal electron gun obtaining easily a large current and stable in electron emission is used. The thermal electron gun heats a cathode 101 made of a material with a low work function to provide electrons with energy enough to overcome a barrier of a cathode surface, and accelerates the electrons toward an anode 103 with a higher potential with respect to the cathode 101. The reference numeral "104" denotes a crossover of electron beams. The "crossover" is an image formed when electron beams emitted in the same direction from different positions in the same cathode cross one another. The size (diameter) of the crossover is called a crossover diameter, and a position where the crossover is formed on the beam axis is called a crossover height.

A source forming lens 105 is an electromagnetic lens having a function of forming an image by reducing the crossover 104. That is, a first intermediate image of the crossover 104 is formed. Herein, since the crossover is used as a light source, it is called a source crossover 106.

Note that as shown in FIG. 14, the electron beams emitted from the electron gun may be incident on the source forming lens 105 without forming a crossover. Also in this case, if a track of the electron beams is extrapolated linearly from a side of the source forming lens and a point 104b crossing on the beam axis is virtually handled as a crossover, this situation is similar to that as described above. Therefore, the point 104b is referred to as a virtual crossover.

By using this source crossover 106 as a light source, a condenser lens 107 produces an approximately parallel electron beam. The condenser lens 107 is an electromagnetic lens. The reference numeral "108" represents an aperture array formed by two-dimensionally arranging apertures. "109" a lens array formed by two-dimensionally arranging electrostatic lenses having the same focal length. "110" and "111" each a deflector array formed by two-dimensionally arranging electrostatic deflectors capable of being driven individually. "112" a blanker array formed by two-dimensionally arranging electrostatic blankers capable of being driven individually.

The approximately parallel electron beam produced by condenser lens 107 is divided by the aperture array 108 into a plurality of electron beams. The divided electron beams are converged at the height of the blanker array 112 by lens action of the corresponding lens array 109. That is, a second intermediate image of the crossover is formed. At this time, the deflector arrays 110 and 111 individually adjust paths of respective electron beams so that the corresponding beams pass through desired positions in the corresponding blankers.

The blanker array 112 controls whether the test sample is irradiated with the corresponding electron beam. That is, the electron beams deflected by the blankers are intercepted by a blanking aperture 114, and does not reach onto the test sample. On the other hand, the beams not deflected by the blanker pass through the blanking aperture 114 to reach onto the test sample 119.

Reducing glasses 113 and 115 and objective lenses 116 and 118 project, on a test sample 119 mounted on a stage 120, the reduced second intermediate image of the crossover formed at the height of the blanker array 112. The position of the reduced projected image is determined depending on a deflection amount by a deflector 117.

SUMMARY OF THE INVENTION

Meanwhile, as a result of studies by the present inventors regarding the above-described charged particle beam applying technology, the following has been revealed.

For example, in the above-described multibeam lithography method, the beams formed by the aperture array 108 preferably pass through a desired position of the corresponding electrostatic lens at a desired angle. In the example of FIG. 13, the beams preferably pass through a center of the electrostatic lens in parallel with respect to a beam axis. To achieve this for all electron beams formed, it is necessary that an array interval between the apertures of the aperture array 108 and an array interval between the electrostatic lenses of the lens array 109 are equal to each other and further the aperture array 108 and the lens array 109 are positioned in appropriate alignment. Furthermore, the electron beam with which the aperture array 108 is irradiated is required to have high parallelism.

By contrast, in the specification of the prior application (Japanese Patent Application No. 2004-262830) by the present applicant, a front focal plane of the condenser lens is made coincide with the height of the intermediate image of the crossover serving as a light source. Therefore, adjustment is made so that the aperture array is irradiated with the electron beams in parallel.

On the other hand, characteristics of the electron beams emitted from the thermal electron gun are determined by a work function of the cathode material, cathode temperature, intensity of an electric field on a cathode surface, and other factors. Of these, the work function of the cathode material is difficult to freely manipulate, so that the cathode temperature is controlled by an amount of currents passing through a heater for heating the cathode 101. Also, the characteristics of the electron beams are controlled by a voltage applied to a Wehnelt cylinder 102 placed so as to control a potential distribution near the cathode 101.

Therefore, the characteristics of the electron beams emitted from the thermal electron gun can be predicted to some extent through simulation, for example. In practice, however, in addition to an assembling error of the electron gun and thermal expansion by heating, for example, the cathode 101 heated at high temperatures are changed in shape by evaporation with time. Therefore, it is difficult to accurately predict an electric field distribution in the electron gun. Moreover, variations and temporal changes of resistance of the heater for heating the cathode are also factors in causing errors in cathode temperature. From these reasons, it is difficult to accurately obtain the height of the crossover through only guesses based on simulation and previous data.

Also, there are strong possibilities that the height of the crossover 104 will change before and after replacement of the cathode 101 and/or adjustment of the electron gun and that the height of the crossover 104 will gradually change due to use for a long time.

Therefore, even if the above-mentioned method and apparatus disclosed in the specification of the prior application (Japanese Patent Application No. 2004-262830) are used to make the front focal plane of the condenser lens 107 coincide with the height of the intermediate image (source crossover 106) of the crossover 104, the height of the intermediate image of the crossover is changed due to the above-described reasons and thus is displaced from the front focal plane of the condenser lens 107. Accordingly, since the condenser lens 107 has to be again adjusted, an adjustment time until drawing is started is increased and throughput of the lithography system is decreased.

Furthermore, a ratio in size between the source crossover 106 and the intermediate image of the crossover converged at the height of the blanker array 112 is determined by an inverse ratio between a distance from the source crossover 106 to a main surface of the condenser lens 107 and a distance from a main surface of the lens array 109 to the blanker array 112. Therefore, if the front focal plane of the condenser lens 107 is aligned with the displaced source crossover 106, the size of the intermediate image of the crossover converged at the height of the blanker array 112 may be changed. This means to vary the size of each beam reaching onto the test sample, so that such variation affects drawing accuracy.

Still further, although the electromagnetic lens is more controllable as compared with the electron gun, the resistance of a coil may be varied due to a change in ambient temperature and the focal length of the lens is varied in some cases. Thereby, the following phenomena occur.

(1) When the focal length of the source forming lens 105 is fluctuated from a desired value, the source crossover 106 is formed at a desired height, that is, a height displaced from the front focal plane of the condenser lens 107. Thereby, the parallelism of the electron beams with which the aperture array 108 is irradiated deteriorates.

(2) Fluctuations of the focal length of the condenser lens 107 means fluctuations of the front focal plane. Therefore, as with (1), since the front focal plane of the condenser lens 107 is shifted with respect to the source crossover 106, the parallelism of the electron beams with which the aperture array 108 is irradiated deteriorates.

Therefore, an object of the present invention is to provide, in a charged particle beam applying apparatus such as an electron beam lithography system, a technology that can facilitate a positional adjustment of a crossover and improve throughput of the apparatus.

The above and other objects and novel features of the present invention will become apparent from the description of the specification and the accompanying drawings.

Outlines of representative ones of the inventions disclosed in the present application will briefly described as follows.

The present invention is to solve the problems described above, and has a feature of providing an end face to the front focal plane of the condenser lens. By using this end face to measure the shape of the electron beams, the shape of the beams on the front focal plane of the condenser lens can be always checked even if the height of the crossover formed by the electron gun or the resistance of the source forming lens is varied. Furthermore, by using that end face to adjust a focal length of the source forming lens so that the shape of the beams becomes the sharpest, adjustment can be made so that the intermediate image of the crossover is formed on the front focal plane of the condenser lens.

Note that since the end face is an obstacle on the beam path at a time of drawing, the present invention is configured to be removable from a beam axis without deteriorating a near vacuum state.

Also, the present invention is characterized by, for a plurality of electron beams, measuring a relative position with respect to the corresponding lens or blanker and by comparing the measured relative position with a relative position at a time of initial adjustment. That is, a change in focal length of the condenser lens is monitored, and adjustment is made if the change in focal length exceeds a tolerance. Thereby, the parallelism of the electron beams with which the aperture array is irradiated can be appropriately managed.

Effects obtained by representative ones of the inventions disclosed in the present application will be briefly described as follows.

The positional adjustment of the crossover is facilitated and the throughput of the charged particle beam applying apparatus can be improved.

DESCRIPTION OF THE PREFERRED EMBODIMENTS

Figure 1:
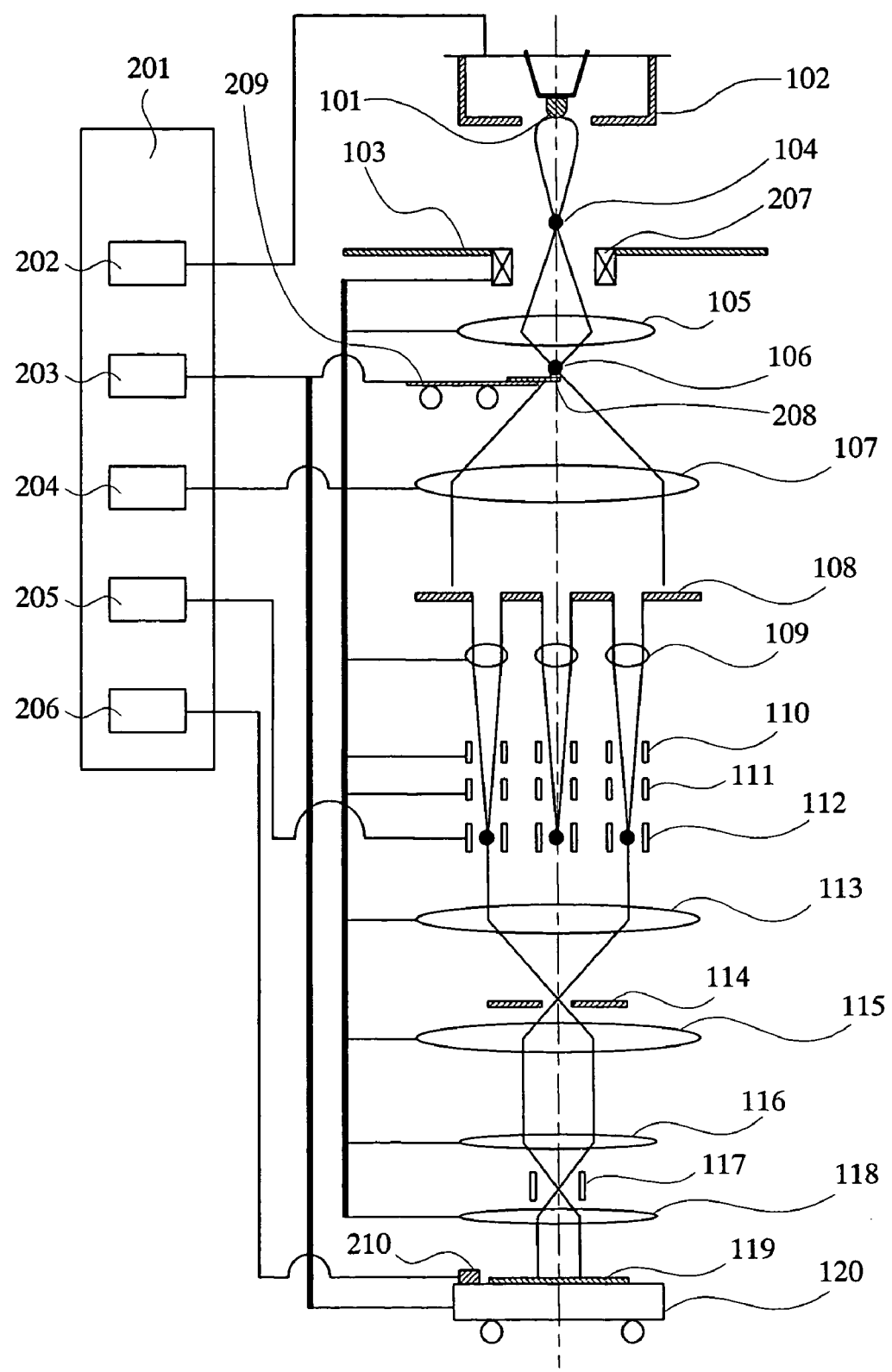
FIG. 1 is a view showing a schematic structure of a multibeam electron-beam lithography system according to a first embodiment of the present invention.

Embodiments of the present invention will be detailed below based on the drawings. Note that, throughout in all of the drawings for describing the embodiments, the same members are denoted in principle by the same reference numerals and repetitive description thereof will not be omitted.

First Embodiment

FIG. 1 is a view showing a schematic structure of a multibeam electron-beam lithography system according to a first embodiment of the present invention. Members shown in FIG. 1 and having the same reference numerals as those in FIG. 13 indicate the same members as those in FIG. 13.

Firstly, with reference to FIG. 1, one example of the multibeam electron-beam lithography system according to the first embodiment will be described. The multibeam electron-beam lithography system according to the first embodiment includes, for example, an electron gun composed of a cathode 101, a Wehnelt cylinder 102, and others; an anode 103; an aligner 207; a source forming lens 105; a movable stage 209 equipped with a crossover regulation edge 208; a condenser lens 107; an aperture array 108; a lens array 109; deflector arrays 110 and 111; a blanker array 112; reducing glasses 113 and 115; a blanking aperture 114; objective lenses 116 and 118; a deflector 117; a stage 120; a Faraday cup 210; a controller 201; and others. Also, this electron-beam lithography system includes a vacuum pump for keeping a charged particle beam path in a vacuum state.

The controller 201 includes an electron-gun control unit 202, a mechanism control unit 203, an optical-system control unit 204, a blanker control unit 205, a data processing unit 206, and others. The electron-gun control unit 202 is electrically connected to the electron gun. The mechanism control unit 203 is electrically connected to the movable stage 209 and the stage 120. The optical-system control unit 204 is electrically connected to the aligner 207, the source forming lens 105, the condenser lens 107, the lens array 109, the deflector arrays 110 and 111, the reducing glasses 113 and 115, and the objective lenses 116 and 118. The blanker control unit 205 is electrically connected to the blanker array 112. The data processing unit 206 is electrically connected to the Faraday cup 210.

As mentioned also in the column of SUMMARY OF THE INVENTION, in the electron beam lithography system according to the present embodiment, it is important to form the source crossover 106 on a front focal plane of the condenser lens 107 and keep, with high accuracy, parallelism of electron beams with which the aperture array 108 is irradiated. However, due to an assembly error of the thermal electron gun, thermal expansion of the electron gun by heating, evaporation of the cathode 101, variations in heater resistance among systems, changes with time, and other factors, it is difficult to form the crossover 104 at a desired height. In particular, the height of the crossover 104 is varied in many cases before and after replacement and/or adjustment of the cathode 101. The height of the source crossover 106 is also varied in many cases accordingly. Therefore, in the present embodiment, the height of the source crossover 106 is adjusted with high accuracy after replacement and adjustment of the cathode 101.

After replacement of the cathode 101 or after adjustment of the electron gun, an acceleration voltage of the electron gun is set at a desired value through the electron-gun control unit 202 of the controller 201. Also, a voltage applied to the Wehnelt cylinder 102 is set so that a current of the electron beam emitted from the electron gun has a desired value.

Figure 2:
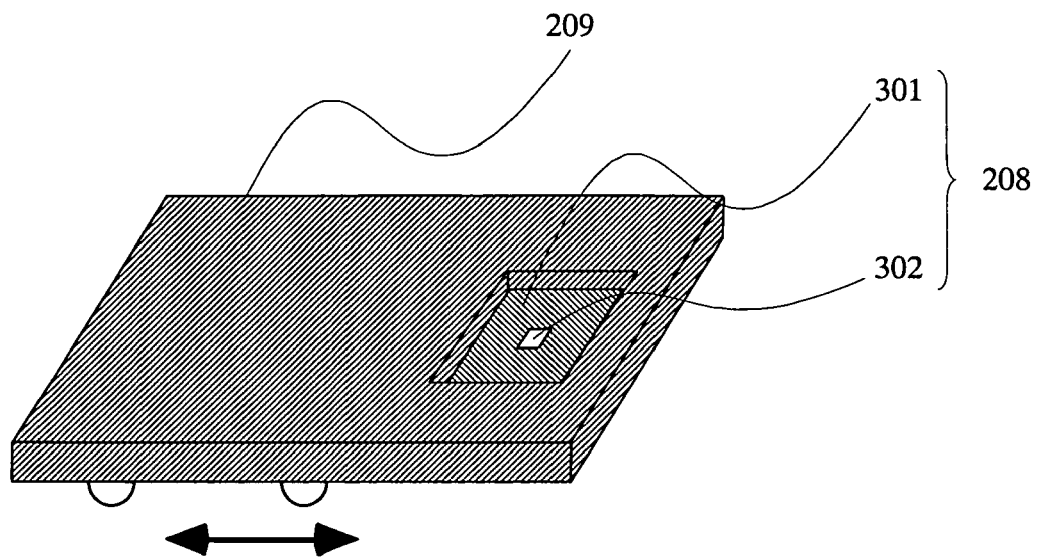
FIG. 2 is a view showing a schematic structure of a crossover regulation edge shown in FIG. 1.

FIG. 2 is a view showing a structure of the crossover regulation edge 208.

The crossover regulation edge 208 is a shielding plate equipped with a sharp end face for regulating an imaging plane of a crossover imaging lens and, for example, includes a molybdenum base 301 and an aperture 302 provided in the molybdenum base 301 and is supported by the movable stage 209. Also, the crossover regulation edge 208 is placed on the front focal plane of the condenser lens 107. By driving the movable stage 209 by the mechanism controller 203, the crossover regulation edge 208 can be inserted on and extracted from a beam axis without substantially impairing a vacuum state of a beam path.

When the height of the source crossover 106 is adjusted in the present embodiment, the crossover regulation edge 208 is inserted on the beam axis and is then scanned on the beam axis with an electron beam.

To the crossover regulation edge 208, the electron beam before being divided by the aperture array 108 is converged. Therefore, the crossover regulation edge 208 is irradiated with the electron beam with a high current density. For this reason, using a material with a high melting point is required for a portion irradiated with the electron beam. Such a high melting point is preferably equal to or higher than 1000 degrees Celsius, for example. In the first embodiment, as shown in FIG. 2, since the aperture 302 is formed in the molybdenum base 301, an end face of the aperture 302 is used as a crossover regulation edge. Tungsten, tantalum, or the like has a high melting point and is therefore suitable as a material other than that of molybdenum. Also, using a sufficiently thick base is required for allowing heat to escape to the outside. The thickness thereof is preferably equal to or larger than 50 microns. In the present embodiment, the thickness is set at 100 microns. Furthermore, a member that is the crossover regulation edge 208 is preferably conductive and non-magnetic.

For scanning with electron beam, the aligner 207 is used, which has been conventionally used as an electromagnetic deflector for optimizing an angle of the electron beam emitted from the electron gun with respect to a downstream electron-optical system. That is, a scanning signal generated from the optical-system control unit 204 is inputted to the aligner 207 to be one-dimensionally or two-dimensionally scanned with electron beam, and then an amount of electron beams passing through the aperture 302 is measured by using the Faraday cup 210 provided on the stage 120. In the present embodiment, the Faraday cup with a sufficiently large aperture is used to keep detection efficiency constant irrespectively of a scan distance by the aligner 207. Alternatively, for example, a semiconductor detector with a large detection area can be used to achieve the same function.

Figure 3:
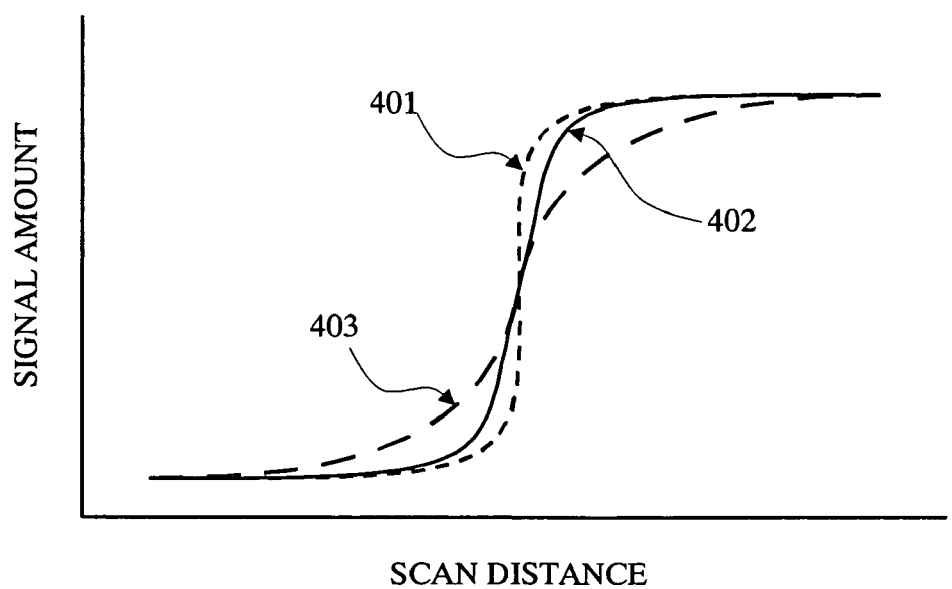
FIG. 3 is a view showing a measurement example of a one-dimensional profile of an electron-beam amount in the first embodiment of the present invention.

FIG. 3 is a view showing a measurement example at a time of measuring a one-dimensional profile of a detection signal of the Faraday cup 210. A horizontal axis represents a scan distance by the aligner 207, whilst a vertical axis represents a detection signal amount of the Faraday cup 210. In FIG. 3, three profiles denoted by the reference numerals "401", "402", and "403" are ones obtained when the current flowing through the source forming lens 105 is varied to have three different values. Under the condition of obtaining the profile 401 whose waveform is the sharpest, the electron beam is converged best to the crossover regulation edge 208.

That is, the optical-system control unit 204 sequentially changes the focal length of the source forming lens 105 and, based on the signal from the Faraday cup 210, the data processing unit 206 determines the shape of the electron beam under individual conditions. By this procedure, the beam is converged on the crossover regulation edge 208, and conditions for forming an intermediate image of the crossover are obtained.

Thereby, since the height of the intermediate image of the crossover has been made coincide with the front focal plane of the condenser lens 107 with high accuracy, the mechanism control unit 203 drives the movable stage 209 to remove the crossover regulation edge 208 from the electron beam path. Then, after other optical parameters are adjusted, the controller 201 starts drawing.

Note that, in the present embodiment, the crossover regulation edge 208 is one-dimensionally scanned with a beam for measuring a one-dimensional profile. Alternatively, scanning may be two-dimensionally performed with an electron beam, and conditions under which the sharpest two-dimensional image can be obtained by being two-dimensionally scanned with the electron beam may be taken as those under which the beam is converged most.

Furthermore, in the present embodiment, as shown in FIG. 2, the aperture of the crossover regulation edge 208 has a rectangular shape. Alternatively, other shapes, such as a polygon or a circle, can achieve similar effects as long as the end face of the aperture is sufficiently sharp in comparison with the size of the electron beam that is a measurement object. Still further, a one-dimensional sharp end face may be used.

Also, in the present embodiment, the Faraday cup 210 provided on the stage 120 is used to obtain a signal required for profile measurement. Alternatively, other means may be used as long as the amount of the electron beams passing through the aperture 302 can be measured. For example, a downstream optical-system element such as the aperture array 108 may measure the amount of electrons reflected, or a measuring element such as a photodiode may be inserted in the beam path.

Still further, if the crossover regulation edge 208 is electrically suspended, that is, insulated with respect to an electron-optical lens tube, the flowing current can be directly measured and therefore this may be used for profile measurement.

As a result of the above-described adjustment performed after adjustment of the electron gun including replacement of the cathode, conditions under which the aperture array is irradiated with the electron beam in parallel can be obtained with high accuracy. Thereby, since positional accuracy of the electron beam reaching onto the wafer is improved, a time required for correction can be shortened. Thus, throughput is improved in device manufacturing.

Note that the procedure according to the present embodiment may be carried out not only after adjustment of the electron gun but also at the time of regular adjustment of optical parameters.

Second Embodiment

Figure 4:
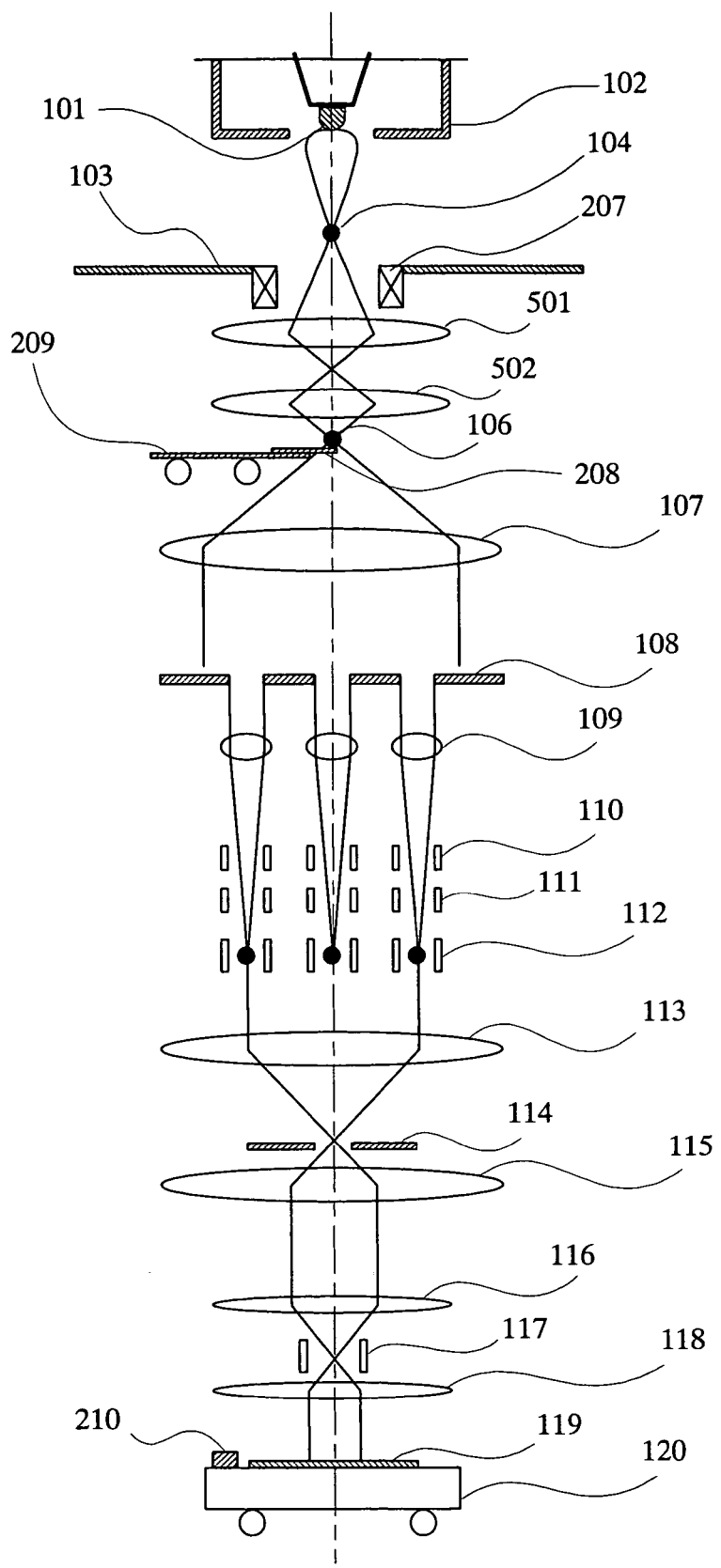
FIG. 4 is a view showing a schematic structure of a multibeam electron-beam lithography system according to a second embodiment of the present invention.
Figure 13:
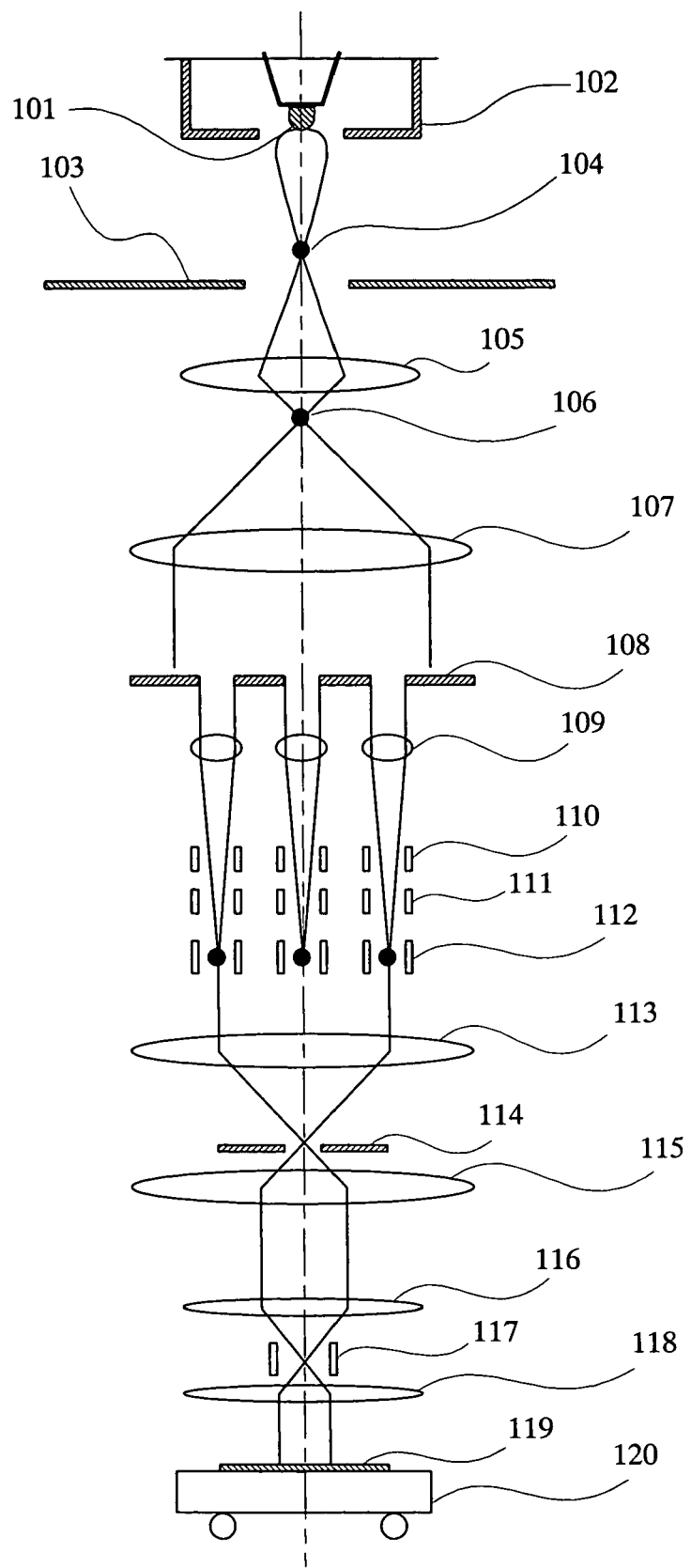
FIG. 13 is a view showing a schematic structure of a multibeam electron-beam lithography system studied as premises for the present invention.
Figure 14:
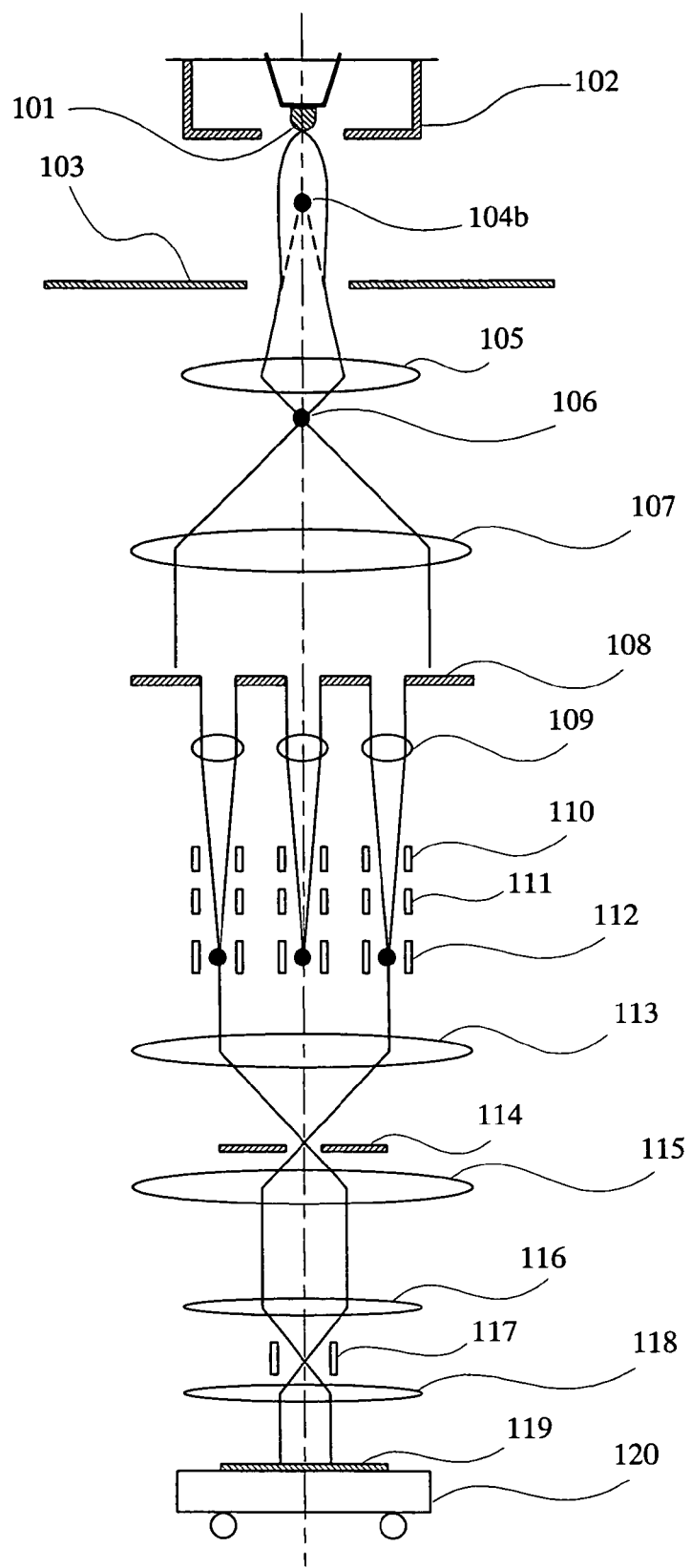
FIG. 14 is a view of a schematic structure of another multibeam electron-beam lithography system studied as premises for the present invention.

FIG. 4 is a view showing a schematic structure of a multibeam electron-beam lithography system according to a second embodiment of the present invention. Components shown in FIG. 4 and having the same reference numerals as those in FIGS. 1 and 13 are identical to those in FIGS. 1 and 13.

In the second embodiment, two-stage electromagnetic lenses, that is, a first source forming lens 501 and a second source forming lens 502 are provided between the front focal plane of the crossover 104 and the front focal plane of the condenser lens 107. By using these lenses, the crossover formed by the electron gun is reduced to form an image on the front focal plane of the condenser lens 107. Since the first source forming lens 501 and the second source forming lens 502 are used together as a zoom lens, the crossover is reduced with an arbitrary magnification to form an image relative to the source crossover 106 on the front focal plane of the condenser lens 107.

Therefore, in the present embodiment, the size of the light source can be freely determined in accordance with the conditions required from the process. For example, the light source is made small in order to obtain high resolution, whilst the light source is made large in order to improve throughput. Thereby, it is preferable to make each beam current large.

What is important in using the first source forming lens 501 and the second source forming lens 502 as a zoom lens is that the intermediate image of the crossover is formed on the front focal plane of the condenser lens 107 irrespectively of the zoom condition and that the parallelism of the electron beam with which the aperture array 108 is irradiated is kept with high accuracy.

The focal length of the electromagnetic lenses can be obtained through simulation with a certain degree of accuracy. However, particularly, when excitation of the electromagnetic lens is intensified, for example, when non-linearity of the relation between the current and the magnetic field is intensified, the accuracy of simulation has a limit.

To get around this problem, for several types of zoom conditions, currents to be applied to the first source forming lens 501 and the second source forming lens 502 are obtained in advance through simulation. Then, in order to make the front focal plane of the source crossover 106 and the front focal plane of the condenser lens 107 coincide with each other with higher accuracy, the following procedure is taken for adjustment.

Figure 5:
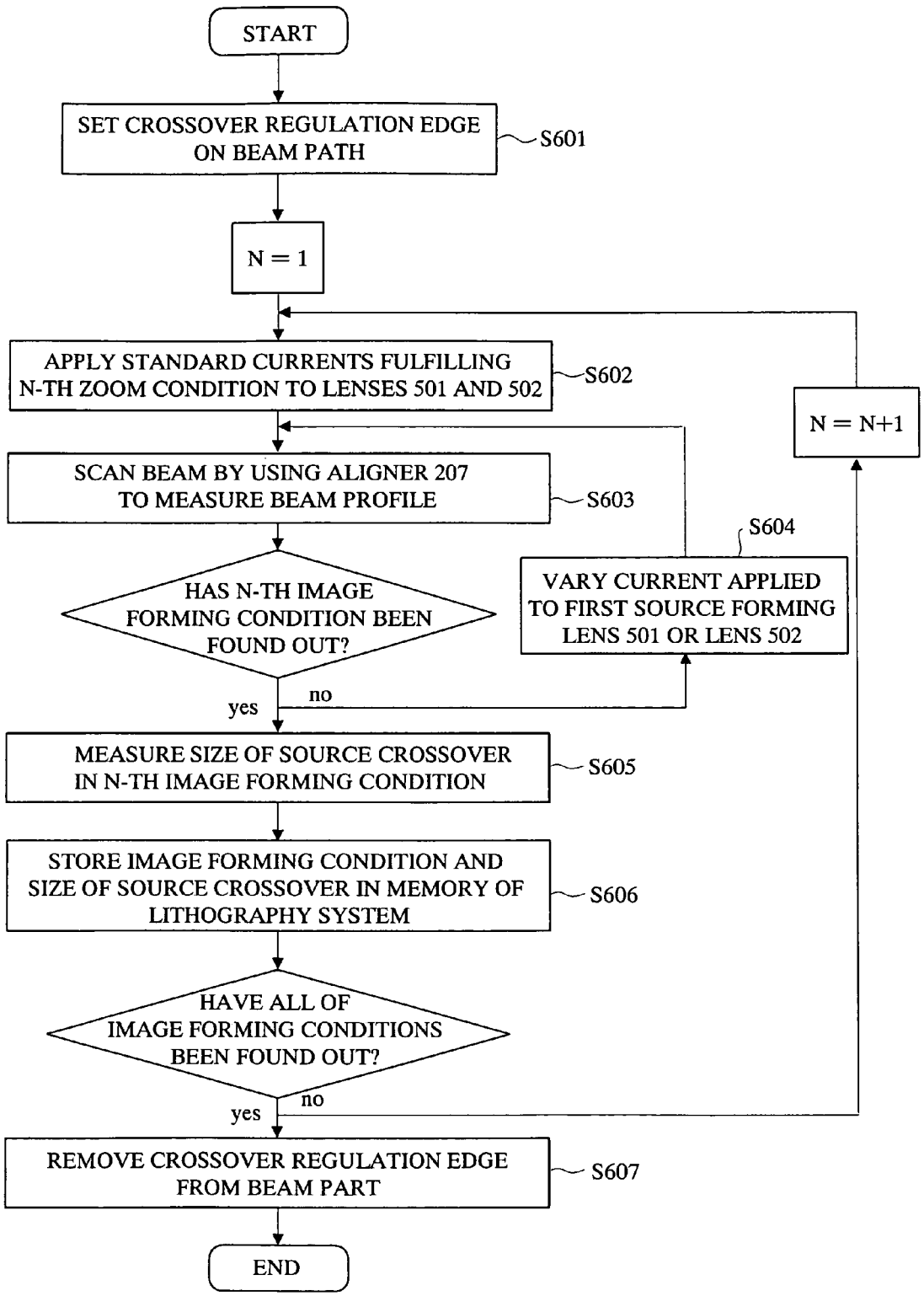
FIG. 5 is a flowchart of a method for obtaining image forming conditions in the second embodiment of the present invention.

FIG. 5 is a flowchart of a method for obtaining image forming conditions in the second embodiment.

In step S601, the movable stage 209 is driven via the mechanism control unit 203, and the crossover regulation edge is set on the electron beam path.

In step S602, standard currents fulfilling a first zoom condition obtained through the simulation (N=1) are applied to the first source forming lens 501 and the second source forming lens 502.

In step 603, while the aligner 207 is used to scan the crossover regulation edge 208 with electron beams, the amount of the passing electron beams is measured by using the Faraday cup 210, whereby the size of the electron beam on the crossover regulation edge 208 is obtained.

In step S604, one of setting currents of the first source forming lens 501 and the second source forming lens 502 is sequentially varied until an image forming condition, that is, a condition under which the size of the beam has a minimum value is obtained.

Steps S602 through S604 are repeated to find a lens condition under which a source crossover is image-formed on the front focal plane of the condenser lens 107 under the first zoom condition.

In step S605, the size of the source crossover under the obtained lens condition is measured. That is, the waveform obtained by scanning the crossover regulation edge 208 with electron beams is subjected to primary differentiation to measure the profile of the source crossover 106. Alternatively, the size of the electron beam reduced and projected on the stage 120 may be measured.

Steps S602 through S605 are performed on a plurality of zoom conditions. Thereby, the setting currents of the first source forming lens 501 and the second source forming lens 502 and the size of the source crossover can be determined correspondingly to each zoom condition.

In step S606, the image forming conditions of the first source forming lens 501 and the second source forming lens 502 obtained through steps S602 to S604 and the size of the crossover obtained in step S605 are stored in a memory incorporated in the controller 201.

Steps S602 through S606 are then performed for a second zoom condition (N=2). The same steps are repeated until all of the image forming conditions are found. Note that "N" is a natural number and represents the number of image forming conditions.

In step S607, the movable stage 209 is driven via the mechanism control unit 203 to remove the crossover regulation edge 208 from the electron beam path.

Figure 6A:
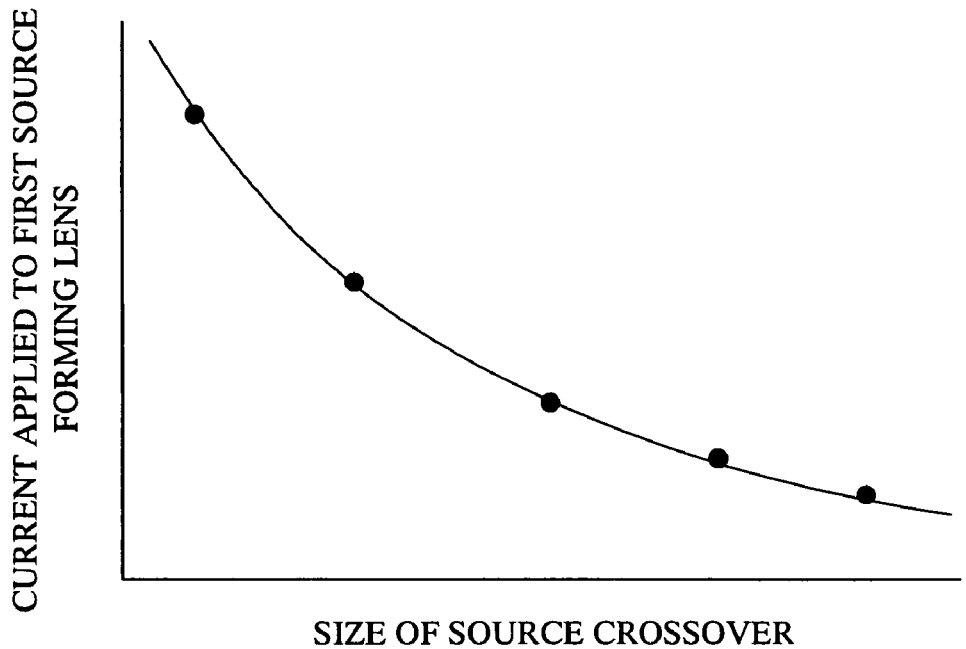
FIG. 6A is a view depicting a relation between a size of a source crossover and a current applied to a first source forming lens in the second embodiment of the present invention.
Figure 6B:
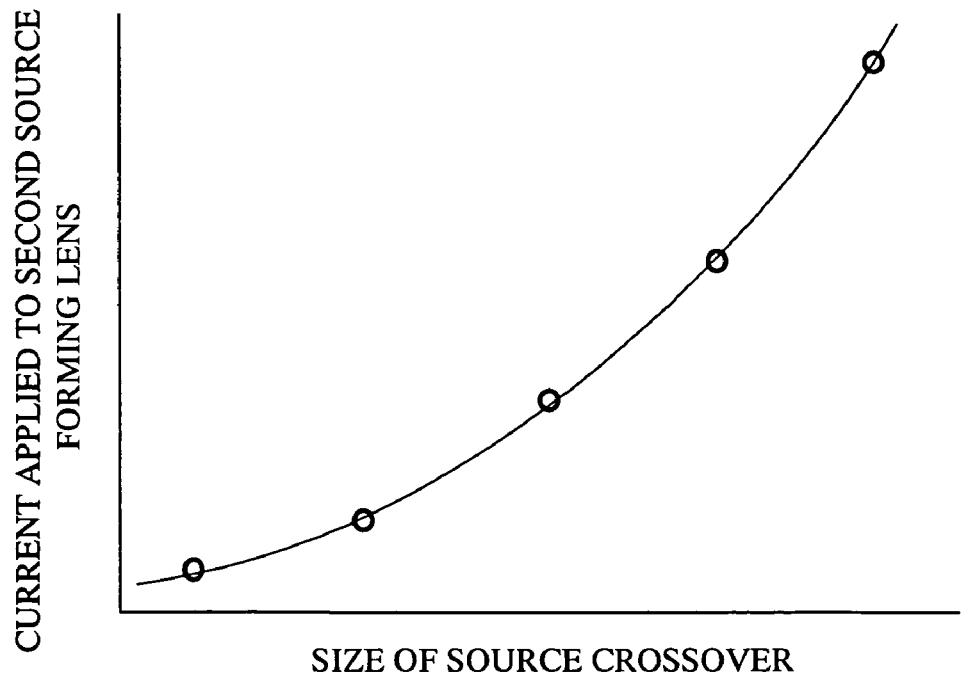
FIG. 6B is a view depicting a relation between a size of a source crossover and a current applied to a second source forming lens in the second embodiment of the present invention.

FIGS. 6A and 6B are graphs of one example of measurement results obtained through the above-described procedure, and represent optimum currents for the first source forming lens 501 and the second source forming lens 502 corresponding to respective source crossovers. FIG. 6A depicts a relation between the size of the source crossover and an optimum current of the first source forming lens 501, whilst FIG. 6B depicts a relation between the size of the source crossover and an optimum current of the second source forming lens 502.

In FIGS. 6A and 6B, curve lines represent results obtained after fitting based on a measurement point where N=5. To make the source crossover small, it can be seen that the current flowing through the first source forming lens 501 is increased to decrease the focal length, whilst the current flowing through the second source forming lens 502 is decreased to increase the focal length.

At the time of drawing, based on these measurement results, a lens current corresponding to a desired crossover diameter is obtained. If no measurement point corresponding to the desired crossover diameter is obtained, the current obtained by fitting is used.

By making the above-described adjustment, the intermediate image (source crossover 106) of the crossover 104 is formed on the front focal plane of the condenser lens 107, whereby the parallelism of the electron beam with which the aperture array 108 is irradiated is kept with high accuracy irrespective of the zoom conditions. Therefore, the size of the source crossover that is optimum for the process can be achieved, and almost the same yield and throughput as those in the first embodiment can be also obtained.

Third Embodiment

In the above first and second embodiments, a single crossover regulation edge regulating the height of the crossover has been used. By contrast, in a third embodiment, a plurality of crossover regulation edges are used.

Figure 7:
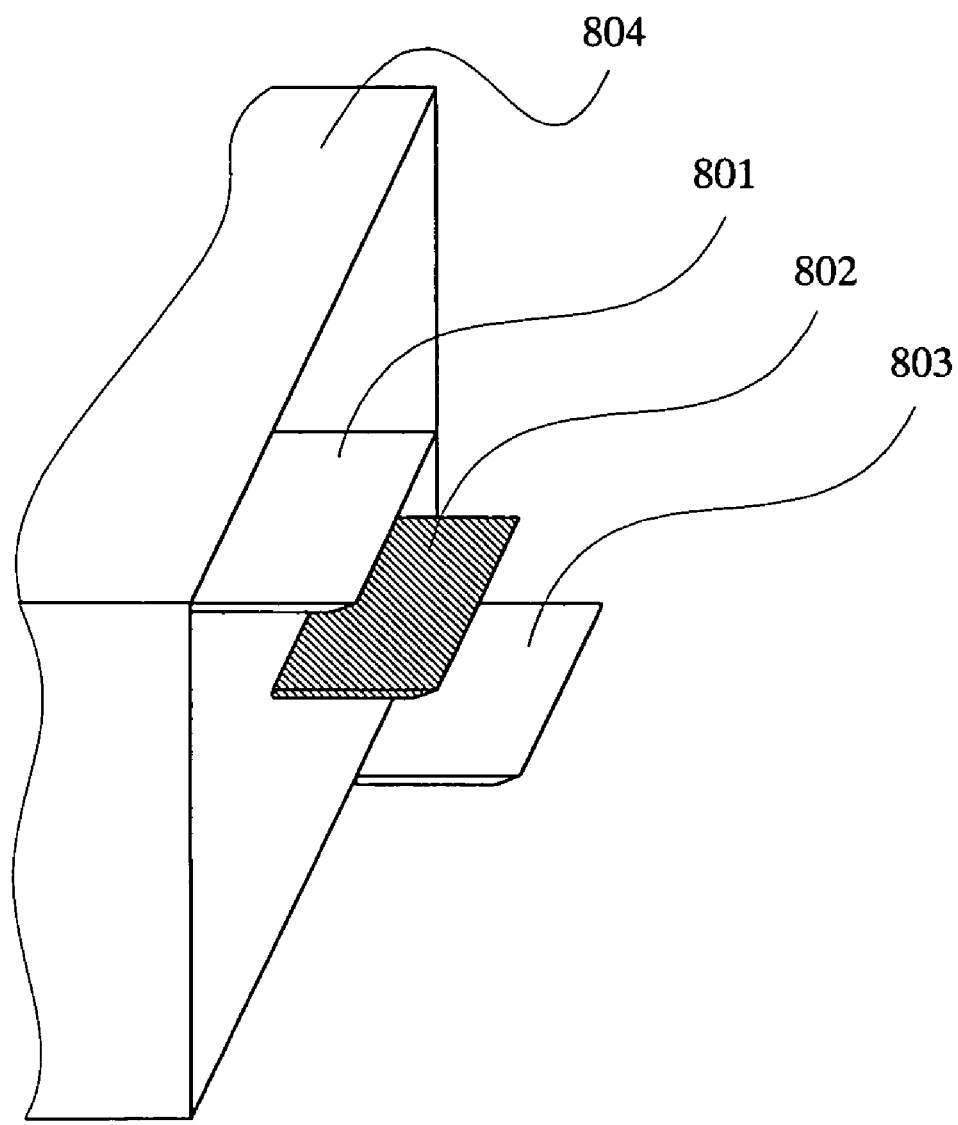
FIG. 7 is a view showing a schematic structure of a crossover regulation edge in a third embodiment of the present invention.

FIG. 7 is a view showing a structure of crossover regulation edges for use in the third embodiment. The reference numerals "801", "802", and "803" denote crossover regulation edges with different heights supported by one movable stage 804. In the third embodiment, in place of the crossover regulation edge 208 and the movable stage 209 as shown in FIGS. 1 and 4, the crossover regulation edges 801, 802, and 803 are placed between the crossover 104 and the condenser lens 107.

Figure 8:
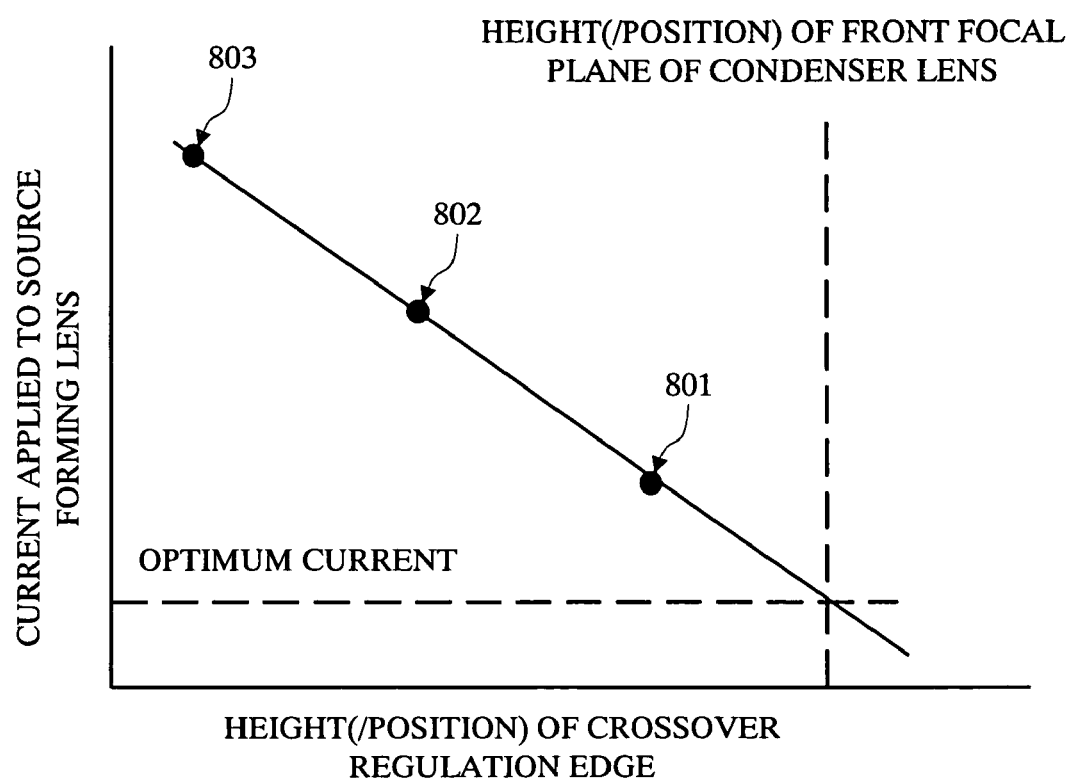
FIG. 8 is a view depicting a relation between a height of a crossover regulation edge and a current applied to a source forming lens in the third embodiment of the present invention.

In the present embodiment, through the same method as that according to the first embodiment, a condition under which an intermediate image of the crossover is formed for each of three crossover regulation edges 801, 802, and 803 is obtained. That is, a current for the source forming lens 105 corresponding to the height of each crossover regulation edge is obtained. FIG. 8 is a graph depicting results experimentally obtained regarding a relation between the height of the crossover regulation edge and the current for the optimum source forming lens 105. A straight line represents fitting results.

The present embodiment is suitable in the case where the crossover regulation edge cannot be placed on the front focal plane of the condenser lens 107 due to space limitations. In such a case, from the relation between the height of the crossover regulation edge and the current of the source forming lens 105 shown in FIG. 8, the current of the source forming lens 105 corresponding to the front focal plane of the condenser lens 107 can be obtained through interpolation or extrapolation.

Figure 9:
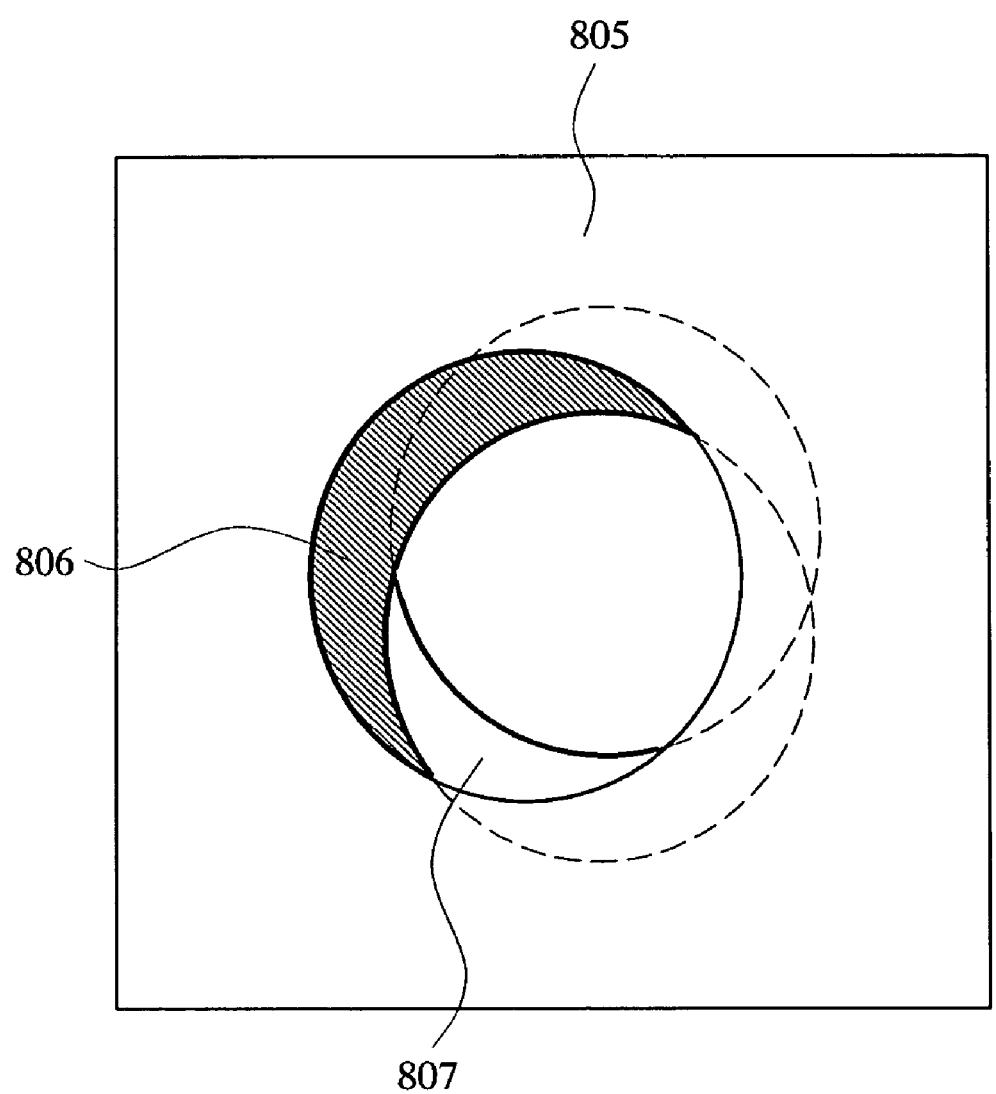
FIG. 9 is a view showing another schematic structure of the crossover regulation edge in the third embodiment of the present invention.

Note that, in the present embodiment, one-dimensional shape edges with sharp end faces are provided at a plurality of heights. Alternatively, as shown in FIG. 9, apertures 805, 806, and 807 with apertures of circles or the like may be placed at a plurality of heights while being eccentric to one another. Note that, in FIG. 9, a positional relation is such that the aperture 805 is at a top, the aperture 806 is at a middle, and the aperture 807 is at a bottom.

Also, the present embodiment is effective even when the height of the front focal plane of the condenser lens 107 has to be moved due to a change in projection conditions.

Fourth Embodiment

In the first to third embodiments, the electron beam lithography system of a type in which the reduced image of the crossover formed by the electron gun is transferred onto the test sample for drawing has been described, and their object is to keep the height of the crossover serving as an object point at a desired position. By contrast, in a fourth embodiment, an electron beam lithography system of a type which is called generally a variable shaped beam method and in which the crossover is not transferred onto the test sample will be described.

Figure 10:
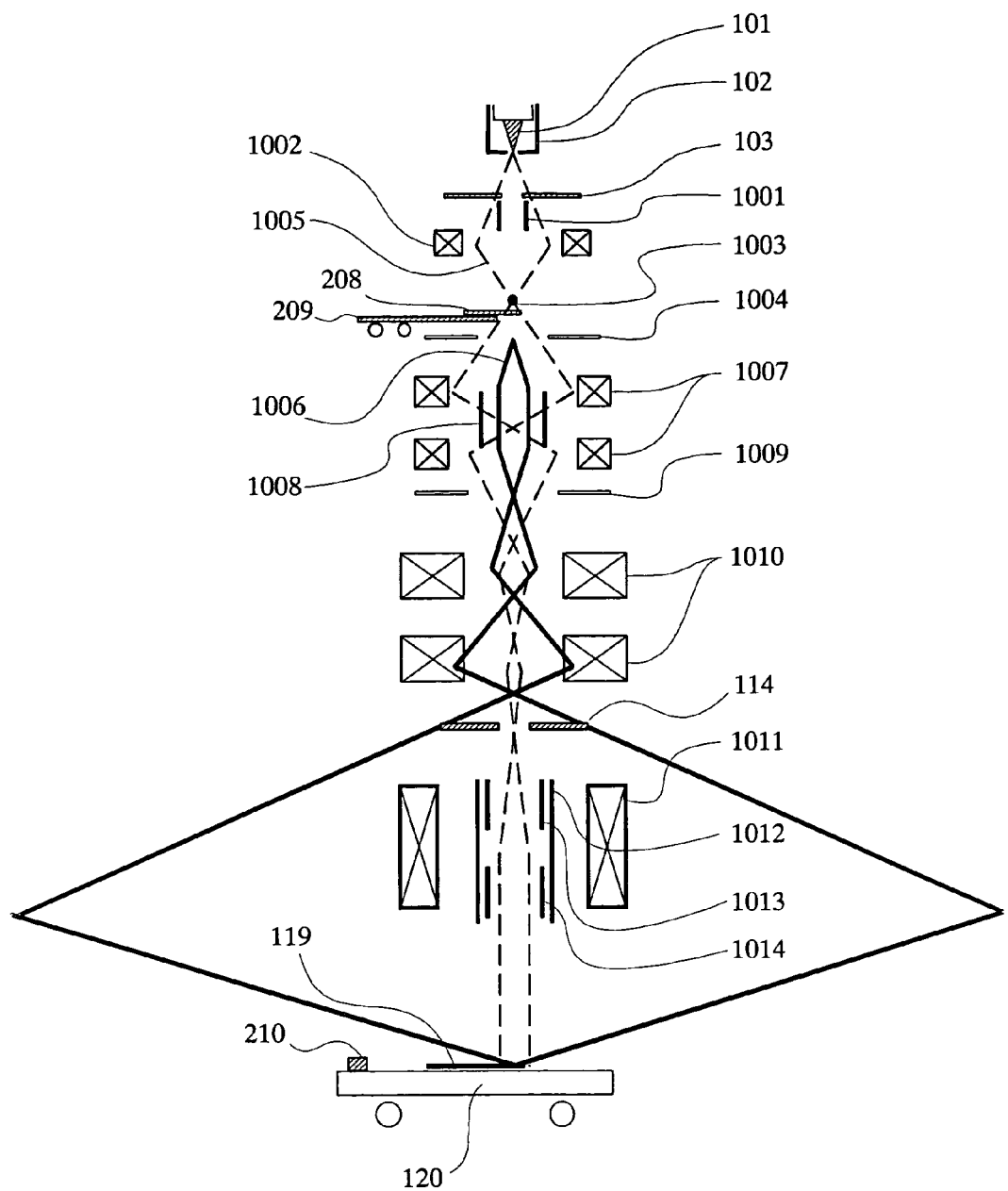
FIG. 10 is a view showing a schematic structure of an electron beam lithography system according to a fourth embodiment of the present invention.

FIG. 10 is a view showing a schematic structure of an electron beam lithography system according to the fourth embodiment of the present invention. Components shown in FIG. 10 and having the same reference numerals as those in FIGS. 1 and 13 are identical to those in FIGS. 1 and 13.

As shown in FIG. 10, an electron beam emitted from the cathode 101 is accelerated toward the anode 103, and is then incident on a condenser lens 1002. The voltage of the Wehnelt cylinder 102 is kept constant. By the action of convergence of a condenser lens 1002, a crossover 1003 is formed near the exit of the condenser lens. The reference numeral "1001" denotes a blanking electrode, which bends track of the electron beam so as to intercept the electron beam with respect to the test sample. That is, the electron beam deflected by the blanking electrode 1001 is intercepted by the blanking aperture 114, thereby not reaching onto the test sample 119. On the other hand, the beam not deflected by the blanking electrode 1001 passes through the blanking aperture 114 to reach onto the test sample 119.

The beam once forming the crossover 1003 spreads again and then irradiates a first mask 1004. Since the first mask 1004 is provided with a single rectangular aperture, an aperture image can be obtained from the irradiated electron beam. The aperture image of the first mask 1004 is formed on a second mask 1009 through the shaping lens 1007. The second mask 1009 is provided with a rectangular aperture for performing a variable shaped beam method and a shaping aperture for performing a character projection method. The image forming position on the second mask 1009 is controlled by a beam shaping deflector 1008, whereby the shape and area of the electron beam are determined. The electron beam passing through the aperture of the second mask 1009 is projected onto the test sample 119 placed on the stage 120 by a reducing lens 1010 and an objective lens 1011.

Inside the objective lens 1011, a deflector group is placed. By this deflector group, the image forming position of the electron beam on the test sample is determined. The deflector group according to the present invention includes a main deflector 1012 with a largest deflection area of 5 millimeters, a sub-deflector 1013 with a second-largest deflection area of 500 microns, and a sub-sub-deflector 1014 with a smallest deflection area of 80 microns. This is a structure of the electron beam lithography system for use in the fourth embodiment.

Here, the reference numeral "1005" denotes an image forming line for the crossover, and "1006" an image forming line for the mask. This means that an aperture image of the first mask 1004 is formed by a shaping lens 1007 on the second mask 1009, reduced by the reducing lens 1010, and is then eventually formed by the objective lens 1011 on the test sample.

Figure 11:
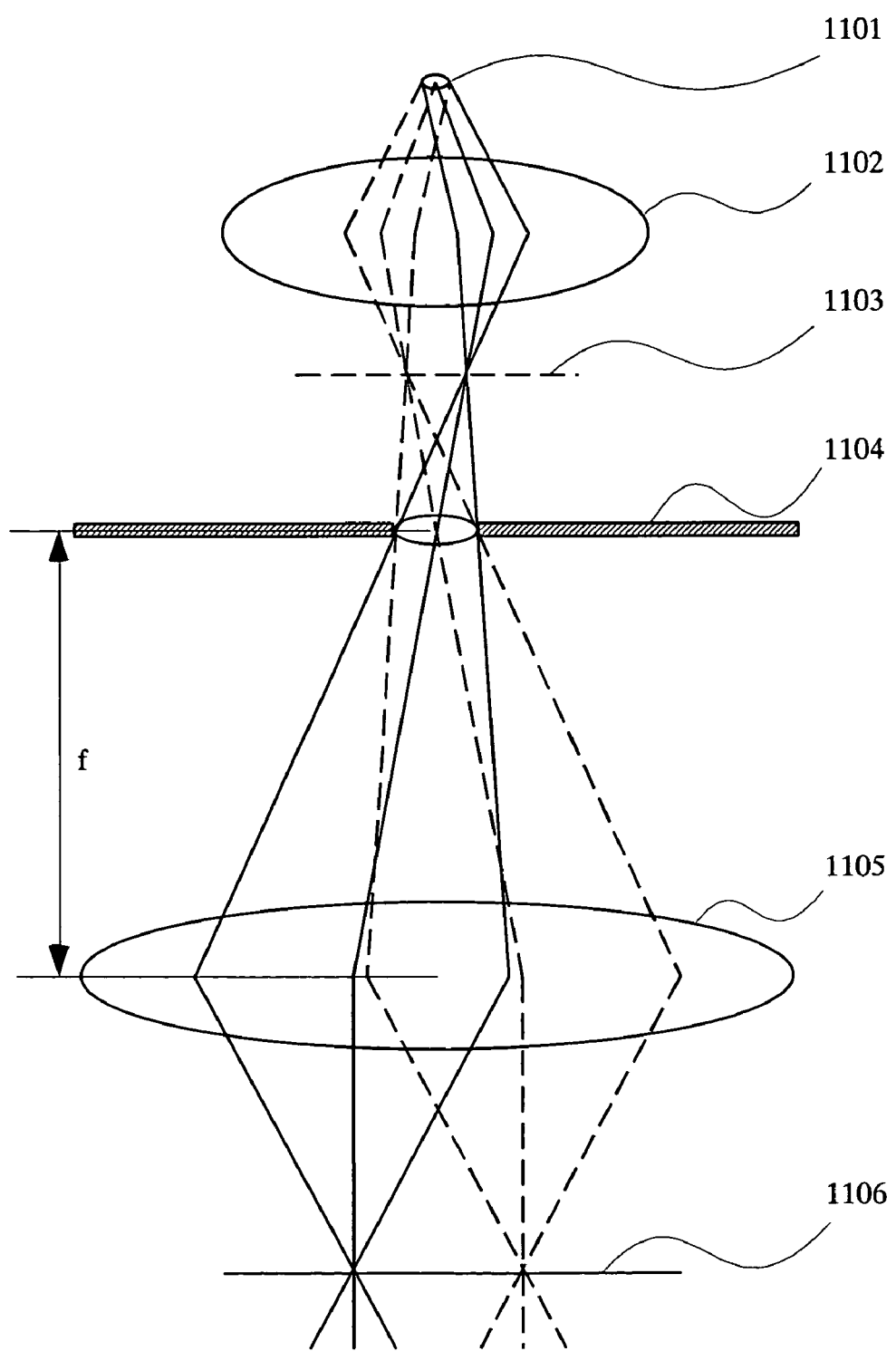
FIG. 11 is a schematic view for explaining Koehler illumination in the fourth embodiment of the present invention.

On the other hand, in the electron beam lithography system of this method, the beam size is required to be not varied when the height of a test sample surface is varied. To achieve this, it is preferable to realize a so-called Koehler illumination, and its realization will be explained with reference to a schematic view of FIG. 11. In FIG. 11, the reference numeral "1101" denotes a light source, which corresponds to an intermediate image of a crossover in the present embodiment. "1102" a light-gathering lens for gathering light emitted from the light source, which corresponds to a part of a reducing lens in the present embodiment. "1103" an image plane, which corresponds to an intermediate image plane of a mask in the present embodiment. "1104" an aperture stop, which corresponds to a blanking aperture in the present embodiment. Depending on the size of the aperture stop, an open angle is determined. The reference numeral "1105" denotes an objective lens and has an effect of transferring an image formed on the image plane 1103 onto a test sample surface 1106 which is an object surface.

Here in FIG. 11, a distance from the aperture stop 1104 to the objective lens 1105 is equal to a focal length f of the objective lens. Therefore, if the aperture stop is caused to form an image from the light source 1101, the image of the light source is formed on the front focal plane of the objective lens 1105. Therefore, as shown by a combination of solid lines and dotted lines, a light beam emitted from one point of the light source passes through the objective lens and then becomes parallel beams. That is, the so-called Koehler illumination is achieved. At this time, since a principal ray is vertically incident on the test sample surface, the size of the image of the mask is not varied in accordance with variations of the height of the test sample surface 1106.

To achieve the Koehler illumination as shown in FIG. 11 in the present embodiment, an intermediate image of the crossover is image-formed on the front focal plane of the objective lens 1011 in FIG. 10, and it is preferable to provide the blanking aperture 114 at a position of the formed intermediate image.

As such, in this method, an image forming relation of the crossover is very important. In FIG. 10, the reference numeral "1005" is an ideal image forming line for the crossover. The crossover is image-formed on the front focal plane of the objective lens, whereby the Koehler illumination is achieved.

However, as described in the column of "SUMMARY OF THE INVENTION, due to an assembly error of the thermal electron gun, thermal expansion of the electron gun by heating of cathode, evaporation of the cathode, variations in heater resistance among systems, changes with time, and other factors, the height of the crossover 1003 is varied before and after replacement of the cathode and/or adjustment of the electron gun in many cases. To get around this problem, in the present embodiment, the crossover regulation edge 208 is scanned with the beam by using an aligner (not shown) located near the anode 103 and the beam profile is measured. Therefore, excitation of the condenser lens 1002 is adjusted so that the crossover 1003 is formed at a desired height.

Note that, in the electron beam lithography system of this method, the magnification of the image on the test sample with respect to the aperture image of the second mask 1009 may be varied for each test sample. In such a case, it is preferable that the focal length is adjusted by excitation of the reducing lens 1010 and the objective lens 1011. Depending on such adjustment, however, the image forming relation of the crossover is also varied. This means that the height at which the crossover 1003 is to be formed is also varied.

In such a case, it is preferable that the crossover regulation edge 208 is configured to be movable in a height direction. Alternatively, as with the third embodiment, a plurality of edges different in height as shown in FIG. 7 may be used. Thereby, a relation between the height of the crossover regulation edge 208 and the current of the condenser lens 1002 can be experimentally obtained. Thus, through interpolation or extrapolation, the current of the condenser lens 1002 corresponding to a desired crossover height can be obtained. In other words, irrespectively of the magnification, an intermediate image of the crossover can be formed on the front focal plane of the objective lens 1011, whereby the Koehler illumination can be achieved.

The present embodiment is more effective when the condenser lens 1002 is formed of two-stages of lenses and acts as a zoom lens. That is, while the crossover diameter is adjusted for each test sample or even each pattern within the same test sample, the crossover can be image-formed at a desired position. For this reason, since the beam current can be varied according to desired accuracy of the current density on the test sample, throughput can be improved.

Fifth Embodiment

A fifth embodiment relates to the multibeam electron bean lithography system shown in FIG. 1. The first to fourth embodiments have aimed at calibrating, for variations in the height of the crossover that are generated in the multibeam drawing method, in particular, generated before and after replacement of the cathode and/or adjustment of the electron gun, the height of the crossover by using the crossover regulation edge. These embodiments have been able to achieve similar effects also for variations near a focal point of a source forming lens.

By contrast, the fifth embodiment solves a problem of variations in the focal length of the condenser lens. A method of adjusting the focal length of the condenser lens is disclosed in the specification of the above-mentioned prior application. In the above specification, the aperture of the blanker array is simultaneously scanned with a plurality of beams to acquire an overlapped image by a plurality of aperture images. By using this overlapped image as an indicator, astigmatism correction of the focal length of the condenser lens and the irradiation optical system is performed. By using this method, the aperture array is irradiated with the electron beam in approximately parallel, so that the method is effective for adjusting the focal length of the condenser lens. It takes some time for this adjustment. Therefore, decreasing the frequency of this adjustment is effective in order to improve throughput of the lithography system.

In practice, however, the resistance of the coil of the condenser lens may be varied due to a change in ambient temperature to cause the focal length of the lens to be varied. To get around this problem, in the present embodiment, after astigmatism correction of the focal length of the condenser lens and the irradiation optical system, only a specific beam is used to acquire the overlapped image of the aperture images, so that the acquired overlapped image is used as a reference aperture image.

Then, every time drawing of each predetermined unit, such as each sheet of test sample or each lot, is finished, an overlapped image of aperture images of a specific beam is acquired through a method similar to that immediately after adjustment, so that the acquired overlapped image is compared with the reference aperture image.

Figure 12A:
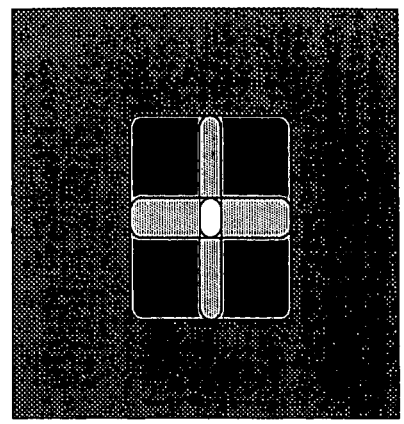
FIG. 12A is a view showing an overlapped image of four corner apertures in a fifth embodiment of the present invention, wherein the overlapped image is an aperture image immediately after adjustment.
Figure 12B:
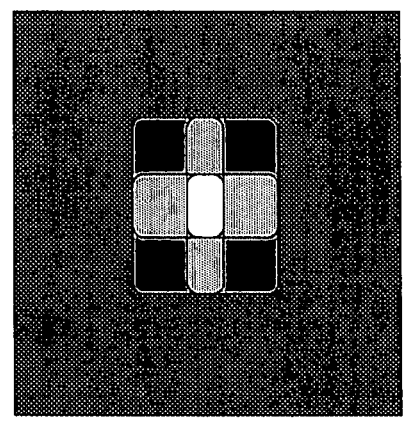
FIG. 12B is a view showing an overlapped image of four corner apertures in a fifth embodiment of the present invention, wherein the overlapped image is an aperture image after drawing for several lots.
Figure 12C:
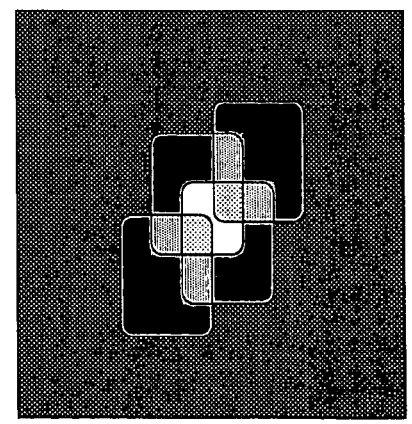
FIG. 12C is a view showing an overlapped image of four corner apertures in a fifth embodiment of the present invention, wherein the overlapped image is an aperture image after drawing for further several lots.

FIGS. 12A through 12C are views each depicting an overlapped image of apertures for four-corner beams. FIG. 12A illustrates an overlapped image of apertures acquired by using four-corner beams of multibeam arrangement immediately after adjustment. To obtain this image, the blanker control unit 205 of the controller 201 shown in FIG. 1 may be used to apply a blanking voltage not to blankers corresponding to the four-corner beams but to blankers corresponding to the other beams for interception with respect to the test sample. Then, the blanker array 112 is scanned with those four-corner beams not subjected to blanking, and a current reaching onto the stage 120 is measured by the Faraday cup 210. Note that, for scanning with the four-corner beams, an aligner (not shown) for alignment of the beam emitted from the lens array 109 with respect the blanker array 112, or a deflector array may be used. Note that, in FIGS. 12A to 12C, the amount of electron beams is large at light-colored portions.

A reason for the fact that the aperture images obtained from the four-corner beams do not completely coincide with one another is due to distortion aberration of the condenser lens 107. That is, even if the formed multibeam has the most ideal arrangement on the whole, when only the four-corner beams are considered, the aperture images do not necessarily coincide with one another.

After adjustment, drawing is started, and then an overlapped image of the aperture images for the four-corner beams is acquired for each lot with the same method. As a result, after drawing for several lots, as shown in FIG. 12B, it has been found that an overlapped image of the aperture images is changed.

Although not exceeding a tolerance, this change has been thought to be an early sign of a change in the focal length of the lens, so that the condenser lens 107 is again adjusted.

Then, after drawing for further several lots, as shown in FIG. 12C, the overlapped image of the aperture images has been changed. Therefore, astigmatism correction of the irradiation optical system is performed through the method disclosed in the specification of the above-mentioned prior application, and then the aperture image as shown in FIG. 12A can be obtained. Note that whether adjustment is made may be determined by an operator. However, such adjustment can be made automatically if an image processing is used to obtain a degree of overlapping of the aperture images and take this degree as an indicator. Therefore, this will be more convenient.

Note that, in the present embodiment, four beams are used for monitoring an irradiation state of the aperture array 108 because at least four beams are required to see variations of three parameters, that is, the focal length of the condenser lens 107 and astigmatism aberration (in a 0-degree direction and in a 45-degree direction). Alternatively, more beams may be used. Another reason is that variations in the focal length of the condenser lens 107 and distortion due to astigmatism aberration are most significant with the four-corner beams.

By carrying out the method of the present embodiment, the focal length of the condenser lens and astigmatism aberration of the irradiation optical system can be achieved at optimum frequencies, whereby the throughput of the lithography system is kept excellent.

As described above, although the invention made by the inventors has been specifically described on the basis of the embodiments, the present invention is not limited to the above embodiments and, needless to say, can be variously modified and altered within the scope of not departing from the gist thereof.

For example, although the apparatus that applies an electron beam has been described in the above embodiments, the present invention is not limited to it. The present invention can be applied to an apparatus that applies other charged particle beams such as ion beams.

The present invention can be applied to a lithography system, a microscope, and an inspection apparatus that apply an electron beam, an ion beam, or the like.

What is claimed is:

1. A charged particle beam applying apparatus including a charged particle gun that generates and accelerates a charged particle beam, a lens that converges the charged particle beam, a deflector that controls a traveling direction of the charged particle beam, a stage on which a test sample is mounted, a vacuum pump that keeps a path of the charged particle beam in a substantially vacuum state, the apparatus comprising:
   a crossover forming lens for causing one of a crossover of the charged particle beam emitted from the charged particle gun and an intermediate image of the crossover to be formed;
   a shielding plate provided with an end face for regulating an image forming plate of the crossover forming lens;
   an aligner for scanning the shielding plate with the charged particle beam; and
   means for measuring an amount of the charged particle beam shielded by the shielding plate.

2. The charged particle beam applying apparatus according to claim 1,
   wherein the shielding plate is movable between a beam axis and an outside of the beam axis without impairing the near vacuum state of the path of the charged particle beam.

3. The charged particle beam applying apparatus according to claim 1,
   wherein a member forming the end face of the shielding plate is conductive and non-magnetic, is formed of a material with a melting point of 1000 or more degrees Celsius, and has a thickness of 50 or more microns.

4. The charged particle beam applying apparatus according to claim 1,
   wherein the shielding plate is movable in upstream and downstream directions with respect to the traveling direction of the charged particle beam.

5. The charged particle beam applying apparatus according to claim 1,
   wherein the shielding plate is provided with a plurality of end faces, and the plurality of end faces are capable of being placed at different points on the beam axis.

6. The charged particle beam applying apparatus according to claim 1,
   wherein the crossover forming lens is formed of a plurality of lenses, thereby acting as a zoom lens for varying a magnification without changing an imaging plane.

7. The charged particle beam applying apparatus according to claim 1, further comprising an aperture through which the charged particle beam spread from the intermediate image of the crossover is divided into a plurality of charged particle beams, and a plurality of lenses that individually converges the plurality of charged particle beams,
   wherein the shielding plate is provided between the charged particle gun and the aperture.

8. The charged particle beam applying apparatus according to claim 7, further comprising a condenser lens that shapes the charged particle beam spread from the intermediate image of the crossover so as to be approximately parallel,
   wherein the shielding plate is capable of being placed on a front focal plane of the condenser lens.

9. The charged particle beam applying apparatus according to claim 1, further comprising a mask that determines a shape of the charged particle beam with which the test sample is irradiated, and a lens that forms an image of the mask on the test sample at a desired magnification,
   wherein the shielding plate is provided between the charged particle gun and the mask.

10. A charged particle beam applying method in a charged particle beam applying apparatus including a charged particle gun that generates and accelerates a charged particle beam, an aligner that controls a traveling direction of the charged particle beam emitted from the charged particle gun, a forming lens that converges the charged particle beam emitted from the charged particle gun, and a shielding plate provided with an end face, the method comprising:
   a first step of inserting the shielding plate onto a path of the charged electron beam;
   a second step of scanning the end face of the shielding plate with the charged particle beam by using the aligner and simultaneously detecting a signal of the charged particle beam shielded by the shielding plate;
   a third step of obtaining a shape of the charged particle beam on the shielding plate based on the signal obtained in the second step;
   a fourth step of adjusting parameters that determine a focal length of the forming lens so that the shape of the charged particle beam obtained in the third step approaches a desired shape;
   a fifth step of recording the parameters obtained in the fourth step on a recording device incorporated in the charged particle beam applying apparatus; and
   a sixth step of removing the shielding plate from the path of the charged particle beam.

11. A charged particle beam applying method in a charged particle beam applying apparatus including a charged particle gun for generating and accelerating a charged particle beam, a stage on which a test sample is mounted, a lens that causes an intermediate image of a crossover formed by the charged particle gun to be formed, a condenser lens that shapes the charged particle beam spread from the intermediate image of the crossover so as to be approximately parallel, an aperture through which the charged particle beam spread from the intermediate image of the crossover is divided into a plurality of charged particle beams, a lens array in which a plurality of lenses for individually converging the plurality of charged particle beams are arranged, a blanker array for individually controlling whether the charged particle beams reach onto the test sample, an aperture plate having apertures with an approximately same interval as an array interval of the lens array, a deflector that scans the aperture plate with the plurality of charged particle beams, and detecting means that measures an amount of charged particle beams passing through the aperture plate, the method comprising the steps:

scanning the aperture plate with at least four specific beams selected by the blanker array to regularly measure an aperture image of the aperture plate; and comparing a measurement result with an aperture image immediately after adjustment to determine when to adjust the condenser lens.

* * * * *